(12) United States Patent
Ito

(10) Patent No.: US 8,040,176 B2
(45) Date of Patent: Oct. 18, 2011

(54) INTERNAL VOLTAGE GENERATING CIRCUIT

(75) Inventor: Takashi Ito, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 85 days.

(21) Appl. No.: 12/569,109

(22) Filed: Sep. 29, 2009

(65) Prior Publication Data

US 2010/0090748 A1 Apr. 15, 2010

(30) Foreign Application Priority Data

Oct. 15, 2008 (JP) .................................. 2008-266336

(51) Int. Cl.
G05F 1/10 (2006.01)
G05F 3/02 (2006.01)
(52) U.S. Cl. ........................................ 327/540; 327/536
(58) Field of Classification Search .................. 327/512, 327/513, 530, 536–541, 543
See application file for complete search history.

(56) References Cited

U.S. PATENT DOCUMENTS

| | | | |
|---|---|---|---|
| 6,169,442 B1 * | 1/2001 | Meehan et al. | 327/513 |
| 6,774,713 B2 * | 8/2004 | Watanabe | 327/540 |
| 6,775,196 B2 * | 8/2004 | Perner et al. | 365/211 |
| 6,888,397 B2 | 5/2005 | Tsuchiya | |
| 7,443,231 B2 * | 10/2008 | Chang | 327/539 |
| 2007/0171956 A1 | 7/2007 | Noguchi | |

FOREIGN PATENT DOCUMENTS

| | | |
|---|---|---|
| JP | 2004-085384 | 3/2004 |
| JP | 2005-016992 | 1/2005 |
| JP | 2007-192718 | 8/2007 |

* cited by examiner

*Primary Examiner* — Quan Tra
(74) *Attorney, Agent, or Firm* — McDermott Will & Emery LLP

(57) ABSTRACT

A temperature-compensated internal voltage having a desired compensation range is generated with a sufficient controllability and stability. A temperature characteristic adding circuit generates a standard voltage having temperature dependence from a reference voltage not having temperature dependence. The standard voltage is A/D-converted and then added with standard code information (TN_VREF <4:0>) which specifies the level of the internal voltage. The additional value (TN_VREF2 <4:0>) is D/A-converted to generate an offset voltage having temperature dependence. The internal voltage of a desired level is generated based on the offset voltage.

3 Claims, 11 Drawing Sheets

FIG. 11

| TN_VREF2<4:0> | vcpp (V) | VREFOS (V) |
|---|---|---|
| 00h | 1.6 | 0.0 |
| 01h | 1.7 | 0.1 |
| 02h | 1.8 | 0.2 |
| 03h | 1.9 | 0.3 |
| 04h | 2.0 | 0.4 |
| 05h | 2.1 | 0.5 |
| 06h | 2.2 | 0.6 |
| 07h | 2.3 | 0.7 |
| 08h | 2.4 | 0.8 |
| 09h | 2.5 | 0.9 |
| 0Ah | 2.6 | 1.0 |
| 0Bh | 2.7 | 1.1 |
| 0Ch | 2.8 | 1.2 |
| 0Dh | 2.9 | 1.3 |
| 0Eh | 3.0 | 1.4 |
| 0Fh | 3.1 | 1.5 |
| 10h | 3.2 | 0.0 |
| 11h | 3.3 | 0.1 |
| 12h | 3.4 | 0.2 |
| 13h | 3.5 | 0.3 |
| 14h | 3.6 | 0.4 |
| 15h | 3.7 | 0.5 |
| 16h | 3.8 | 0.6 |
| 17h | 3.9 | 0.7 |
| 18h | 4.0 | 0.8 |
| 19h | 4.1 | 0.9 |
| 1Ah | 4.2 | 1.0 |
| 1Bh | 4.3 | 1.1 |
| 1Ch | 4.4 | 1.2 |
| 1Dh | 4.5 | 1.3 |
| 1Eh | 4.6 | 1.4 |
| 1Fh | 4.7 | 1.5 |

←Ta=RT (at 0Bh)

RIGHT SHIFT $\frac{TN\_VRFAD<3:0>}{2} + TN\_VREF<4:0>$

LEFT SHIFT $TN\_VREF<4:0> + 2 \cdot TN\_VRFAD<3:0>$

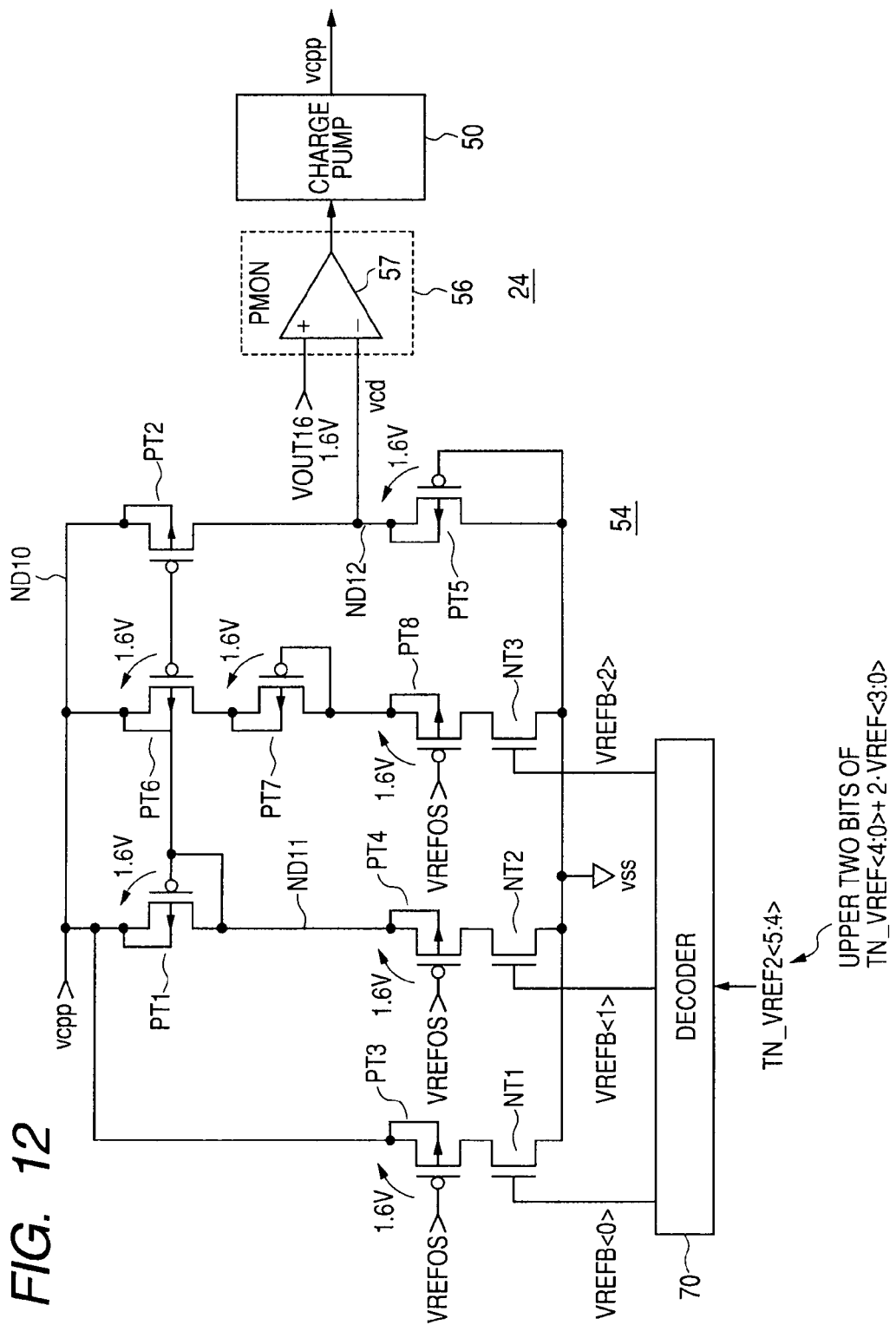

INTERNAL VOLTAGE GENERATING CIRCUIT

CROSS-REFERENCE TO RELATED APPLICATIONS

The disclosure of Japanese Patent Application No. 2008-266336 filed on Oct. 15, 2008 including the specification, drawings and abstract is incorporated herein by reference in its entirety.

BACKGROUND OF THE INVENTION

The present invention relates to an internal voltage generating circuit which generates an internal voltage utilized inside an integrated circuit device, in particular, relates to configuration of the internal voltage generating circuit which has a temperature compensation function of the internal voltage.

The operating characteristic of a semiconductor element has temperature dependence, and a value of resistance of a resistive element also has temperature dependence. When a circuit is comprised of an active element and a passive element, such as a semiconductor element and a resistive element, temperature dependence occurs in the operating characteristic of the circuit, making it difficult to stably obtain the desired characteristic. For example, in a nonvolatile memory, information is stored by accumulating charges in a charge storage layer. The transfer rate of charges has temperature dependence, and a rise of temperature will reduce the transfer rate of charges under the influence of a lattice vibration etc. Therefore, such situation will make it difficult to move sufficient charges within a given length of time, and a data write/erasure/holding property will deteriorate.

In order to compensate such temperature dependence of the element characteristic and to obtain a stable operating characteristic in a broad temperature range, measures are taken generally to suppress a circuit property degradation by generating an internal voltage which has temperature dependence. That is, temperature compensation is made to an internal voltage, such as an internal power supply voltage, so as to impart temperature dependence to the internal voltage. In order to make such temperature compensation, temperature of a semiconductor chip in which a semiconductor integrated circuit device is formed is detected using a temperature sensor, and a voltage level or circuit operation property is changed according to the detected temperature.

An example of configuration of such a temperature detection circuit is disclosed by Patent Literature 1 (Japanese Unexamined Patent Publication No. 2007-192718), Patent Literature 2 (Japanese Unexamined Patent Publication No. 2005-16992), and Patent Literature 3 (Japanese Unexamined Patent Publication No. 2004-85384). In the configuration disclosed by Patent Literature 1, a temperature-independent voltage and a temperature-dependent voltage are generated, and then, the difference of the temperature-independent voltage and the temperature-dependent voltage is obtained and amplified, to generate a second temperature-dependent voltage. By comparing the second temperature-dependent voltage with a temperature-independent standard voltage, a signal indicative of temperature is activated, based on the comparison result (with reference to the temperature-independent voltage, the analog-to-digital conversion of the second temperature-dependent voltage is performed).

In Patent Literature 1, by reducing dependence of the temperature-dependent voltage on a power supply voltage and a manufacturing process, and by enhancing the dependence on temperature etc., stable detection of a chip temperature is promoted, without being influenced by process fluctuation and power supply potential fluctuation. In one embodiment of Patent Literature 1, a refresh interval of DRAM (dynamic random access memory) is adjusted according to the temperature detection result, such that the refresh interval is made short at high temperature and made long at low temperature.

Patent Literature 2 discloses a temperature detection device aiming at improving a temperature measurement accuracy. That is, a difference of a base-emitter voltage of a diode-coupled bipolar transistor at the time of supplying a constant current and at the time of supplying an N-fold constant current is obtained, and temperature is detected using the difference. The difference is generated by converting the constant current and the N-fold constant current into digital values.

In Patent Literature 2, in order to generate an N-fold constant current, a constant current from a constant current source is supplied to each of N transistors arranged in parallel; accordingly, improvement of the consistency of the constant current and the N-fold constant current is promoted.

Patent Literature 3 generates a standard voltage of which the level is programmable, and a current corresponding to the standard voltage is flowed through a diode element, and a voltage drop of the diode element is detected by a voltage follower to generate an analog voltage. The analog voltage is converted into a digital value by an A/D conversion circuit. In the A/D conversion circuit, a digital voltage which is adjusted by count value of a counter is compared with the analog voltage by a comparator, and the count value is stored in a register based on the comparison result. Temperature information obtained by the comparison result is stored in the register, transmitted to an external CPU, and the temperature compensation is performed.

In Patent Literature 3, since operating characteristics (transmissivity etc.) of an electro-optics element and others differ depending on an operating environment temperature, a high-precision temperature compensation is made by suppressing the influence of the manufacturing process and temperature, in order to apply voltage corresponding to the environmental temperature.

Patent Literature 1: Japanese Unexamined Patent Publication No. 2007-192718

Patent Literature 2: Japanese Unexamined Patent Publication No. 2005-16992

Patent Literature 3: Japanese Unexamined Patent Publication No. 2004-85384

SUMMARY OF THE INVENTION

When temperature compensation is made for an internal voltage and the compensation range of the internal voltage is small, no problem occurs in a circuit operation. Corresponding to a center value of the internal voltage, the operating characteristic of each circuit is set up, and as the result, an MOS transistor can be operated stably, for example. However, when the temperature compensation of the internal voltage is made large with a wide voltage range, and when the internal voltage changes largely depending on temperature, there will occur a problem that an operating condition of the MOS transistor becomes severe. For example, when the temperature compensation of an internal power supply voltage is made large, a gate-source voltage of the MOS transistor becomes near the threshold voltage thereof. Consequently, it becomes difficult to operate the MOS transistor stably and to secure operational stability of the circuit. Also, as for an amplifier which generates a temperature-dependent voltage, the amplifier is forced to operate in an operation region with poor sensitivity in some cases, and it becomes difficult to generate voltage to which an accurate temperature compensation is made.

In Patent Literature 1 described above, the chip temperature is obtained and outputted as a digital value. Accordingly, Patent Literature 1 fails to disclose configuration in which further temperature compensation is performed to the detection digital value (temperature after digital conversion). That is, in Patent Literature 1, the detected temperature is converted into a digital value, and a refresh interval of DRAM is only adjusted according to the digital temperature value. In a case where the internal power supply voltage has temperature dependence, neither teaching nor suggestion has been given at all about the configuration which compensates the operating characteristic of the temperature detection unit, and about stabilization of the operation.

Patent Literature 2 aims at performing temperature measurement with a higher degree of precision using an NPN bipolar transistor, but fails to disclose how to utilize a digital value which indicates the detected temperature. In the case of generating voltage which has large temperature dependence corresponding to the detected temperature, neither teaching nor suggestion is given at all about stabilization of the circuit operation and configuration which affords an accuracy guarantee of a temperature-dependent voltage.

In Patent Literature 3, current corresponding to a divided standard voltage having a programmable level is flowed through a diode element, and a voltage drop of the diode element is converted into an analog voltage using a voltage follower. The analog voltage is then converted into a digital value, and transferred to an external CPU (central processing unit). In the CPU, necessary temperature compensation is performed according to the digital temperature information. Also in Patent Literature 3, in a generating unit of the standard voltage with a programmable level and an internal voltage generating unit, the divided standard voltage and the internal voltage have temperature dependence; however, no consideration is given to fluctuation of the operating characteristic of the circuit which generates such voltages, in case the voltage level changes depending on temperature. Patent Literature 3 also fails to disclose configuration in which how the temperature compensation of the internal voltage is made by using information of the voltage (temperature) after digital conversion.

The present invention has been made in view of the above circumstances and provides an internal voltage generating circuit which can make temperature compensation of an internal voltage over a broad temperature range with a high precision.

An internal voltage generating circuit according to one embodiment of the present invention generates a standard voltage which has temperature dependence from a reference voltage which does not have temperature dependence, and converts the standard voltage into a digital value by an analog-to-digital conversion circuit. The output digital value of the analog-to-digital conversion circuit is added with a basic digital value which specifies the level of an internal voltage to be generated. The added result is D/A-converted from digital to analog, and the desired internal voltage is generated based on the analog conversion value.

The standard voltage which has temperature dependence is A/D-converted, and added with a standard digital value. Since a digital additional value is utilized, it is possible to avoid that the operating conditions of the analog circuit become severe owing to the temperature compensation of the internal voltage, and it is possible to generate the power supply voltage (internal voltage) which has a temperature characteristic covering a broad range, with sufficient controllability and stability.

BRIEF DESCRIPTION OF THE DRAWINGS

FIG. 11 is a drawing illustrating a correspondence list of a digital additional value, an internal power supply voltage, and an offset voltage, according to Embodiment 2 of the present invention; and FIG. 12 is a drawing schematically illustrating an example of configuration of a charge pump voltage generating circuit according to Embodiment 2 of the present invention.

DETAILED DESCRIPTION OF THE PREFERRED EMBODIMENTS

Embodiment 1

Figure 1:
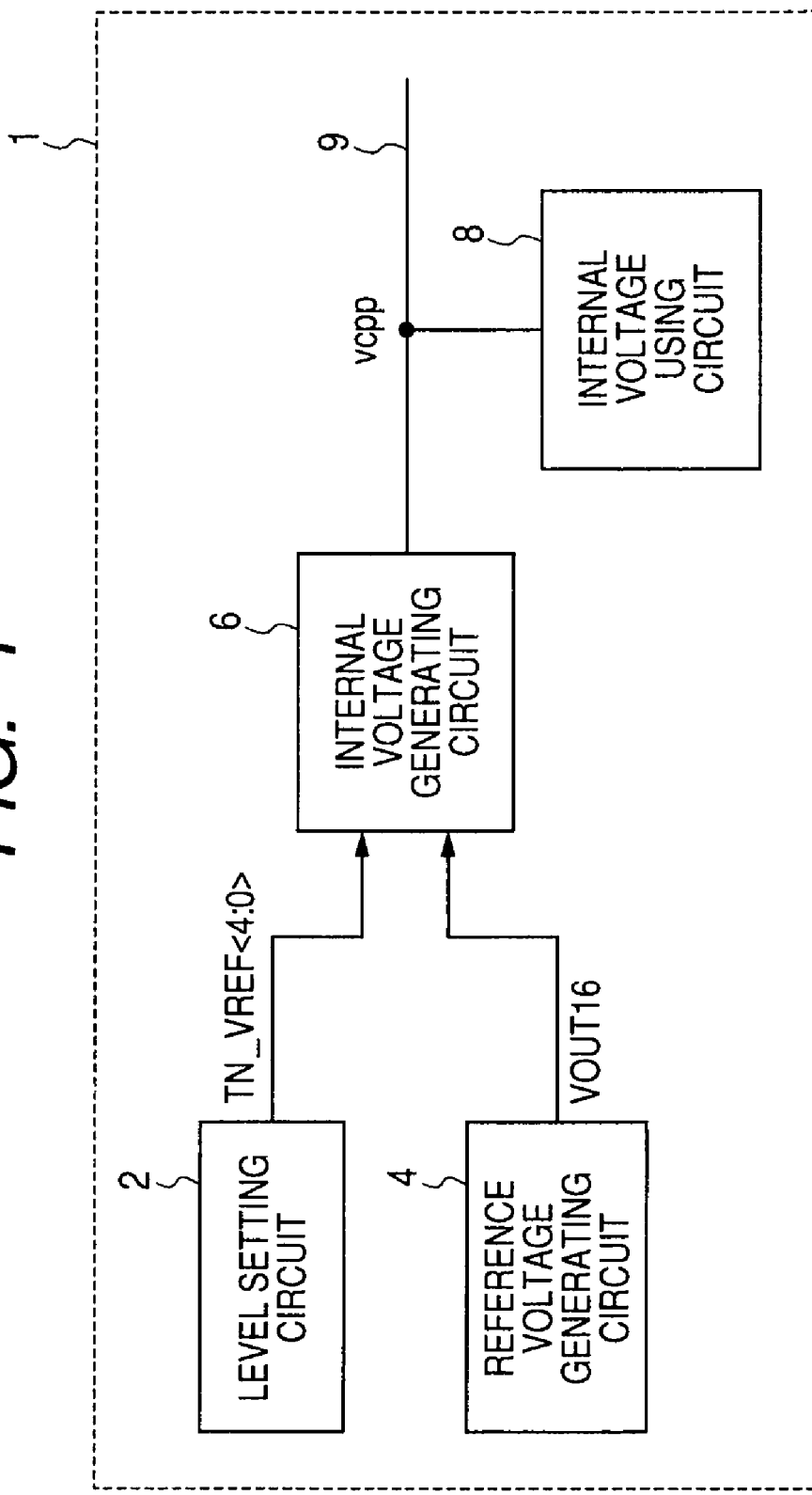
FIG. 1 is a drawing schematically illustrating an entire configuration of a semiconductor integrated circuit device to which the present invention is applied.

FIG. 1 schematically illustrates an entire configuration of the semiconductor integrated circuit device including an internal voltage generating circuit, according to Embodiment 1 of the present invention. As illustrated in FIG. 1, the semiconductor integrated circuit device 1 comprises a level setting circuit 2 which generates a basic voltage code (digital value) TN_VREF <4:0> to specify a desired voltage level of an internal voltage VCPP, a reference voltage generating circuit 4 which generates a reference voltage VOUT16 independent of temperature, and an internal voltage generating circuit 6 which generates an internal voltage VCPP according to the basic voltage code TN_VREF <4:0> and the reference voltage VOUT16. The internal voltage generating circuit 6 generates the internal voltage VCPP on an internal power supply line 9, and the internal voltage VCPP is used by an internal voltage using circuit 8.

The level setting circuit 2 generates the basic voltage code TN_VREF <4:0> which specifies a voltage level required according to an application of the internal voltage VCPP. The basic voltage code TN_VREF <4:0> is uniquely defined according to an application of the internal voltage VCPP in the internal voltage using circuit 8.

The reference voltage generating circuit 4 generates the reference voltage VOUT16 of a prescribed voltage level having no temperature dependence using transistor elements etc. which have a positive temperature characteristic and a negative temperature characteristic as an example.

Although the minute configuration of the internal voltage generating circuit 6 is explained later, the internal voltage generating circuit executes the following processes. That is, temperature characteristic is added to the reference voltage VOUT16, and a standard voltage having temperature dependence is generated. The standard voltage having the temperature dependence is converted into digital data, and the generated digital standard voltage is added with the basic voltage code TN_VREF <4:0>. The digital additional value is D/A-converted, and an internal voltage VCPP is generated based on the analog conversion value.

In the internal voltage generating circuit 6, by performing the digital addition, a temperature compensation range (voltage change range) of the standard voltage to which the temperature characteristic has been added internally is made small, and the standard voltage is generated with sufficient stability and accuracy. The temperature compensation range made small can be enlarged by the add operation, and the temperature characteristic of a broad voltage range can be added to the reference voltage with sufficient controllability and stability.

The internal voltage using circuit 8 may be a circuit which uses the present internal voltage VCPP. For example, in a flash memory etc., when the internal voltage VCPP is an erasure/writing voltage, the erasure/writing voltage is supplied to a selected flash memory cell depending on the erasure/writing mode.

In the above-described configuration, the level setting circuit 2 is illustrated as integrated over the same chip as the internal voltage generating circuit 6. Alternatively, however, the level setting circuit may be included in the control circuit which performs internal operation control according to an operation mode and at the same time sets up the level of the internal voltage, in a flash memory, for example.

Figure 2:
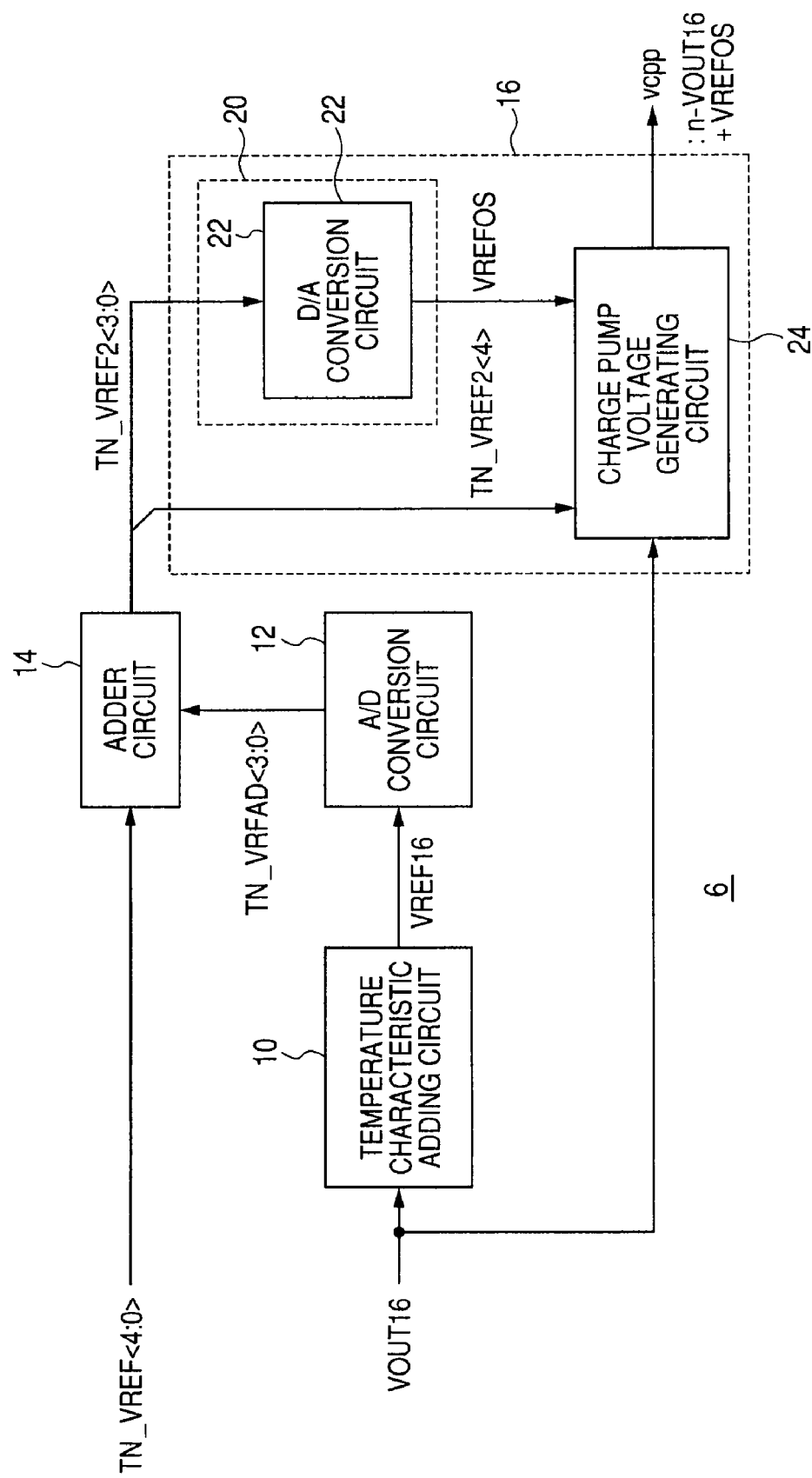
FIG. 2 is a drawing schematically illustrating a configuration of an internal voltage generating circuit illustrated in FIG. 1.

FIG. 2 schematically illustrates an example of configuration of the internal voltage generating circuit 6 illustrated in FIG. 1. In FIG. 2, the internal voltage generating circuit 6 includes a temperature characteristic adding circuit 10, an analog-to-digital conversion circuit 12, an adder circuit 14, and an internal power supply circuit 16. The temperature characteristic adding circuit 10 generates an analog internal standard voltage VREF16 having temperature dependence. The analog-to-digital conversion circuit 12 converts the analog internal standard voltage VREF16 into a 4-bit digital value TN_VRFAD <3:0>. The adder circuit 14 adds the basic voltage code TN_VREF <4:0> and a digital-converted standard voltage value (hereafter called as a digital standard voltage code) TN_VRFAD <3:0>. The internal power supply circuit 16 generates an internal voltage (internal power supply voltage) VCPP according to an output digital value (hereafter called as a target standard voltage code) TN_VREF2 <4:0> of the adder circuit 14, and the reference voltage VOUT16.

The temperature characteristic adding circuit 10 adds a temperature characteristic to the reference voltage VOUT16 not having temperature dependence, outputted by the reference voltage generating circuit 4 illustrated in FIG. 1, and generates an internal standard voltage VREF16 having temperature dependence. The temperature dependence of the internal standard voltage VREF16 is small, and the voltage change range is small; therefore, it is possible to operate the temperature characteristic adding circuit 10 stably.

The A/D conversion circuit 12 has configuration of the ordinary analog-to-digital conversion circuit, performs the analog-to-digital conversion (A/D conversion) of the analog internal standard voltage VREF16 outputted by the temperature characteristic adding circuit 10, and generates a 4-bit digital standard voltage information TN_VRFAD <3:0>.

The adder circuit 14 has configuration of the ordinary digital adder circuit, performs the digital addition of the standard code information TN_VREF <4:0> outputted by the level setting circuit 2 illustrated in FIG. 1 and the digital standard voltage information TN_VRFAD <3:0> outputted by the A/D conversion circuit 12, and generates a 5-bit digital standard voltage code TN_VREF2 <4:0> corresponding to the standard voltage having desired temperature dependence. By the present digital addition, it is possible to generate the standard voltage having a temperature compensation value which changes in a broad range.

The internal power supply circuit 16 has a digital-to-analog conversion function. Based on the target standard voltage code TN_VREF2 <4:0>, the internal power supply circuit 16 generates an internal voltage (internal power supply voltage) VCPP with large temperature dependence which the target standard voltage code TN_VREF2 <4:0> has.

The internal power supply circuit 16 includes an offset voltage generating circuit 20 and a charge pump voltage generating circuit 24. The offset voltage generating circuit 20 includes a D/A conversion circuit 22 which converts a lower 4-bit standard voltage code TN_VREF2 <3:0> outputted by the adder circuit 14 to an analog value. The offset voltage generating circuit 20 generates an offset voltage VREFOS of the internal standard voltage VREF16. The charge pump voltage generating circuit 24 generates the internal voltage VCPP by performing a charge pump operation according to the offset voltage VREFOS from the offset voltage generating circuit 20 and the most significant code bit TN_VREF2 <4> from the adder circuit 14.

The offset voltage generating circuit 20 generates an analog voltage by performing resistive subdivision of a voltage corresponding to the reference voltage VOUT16 according to the 4-bit code TN_VREF2 <3:0>, and generates an offset voltage VREFOS. Accordingly, the same temperature characteristic as the standard voltage VREF16 is imparted to the offset voltage VREFOS by the adder circuit 14. Therefore, the temperature-compensated offset voltage VREFOS is generated at a desired voltage level which has a voltage change range depending on temperature.

The charge pump voltage generating circuit 24 includes a monitor circuit which monitors the voltage level of the internal voltage VCPP, and adjusts the monitor level as a function of a temperature range. The adjustment of the monitor level is performed according to the code bit TN_VREF2 <4> and the offset voltage VREFOS.

The voltage level of the internal voltage VCPP generated by the charge pump operation is set at a level of n·VOUT16+VREFOS. The temperature dependence of the offset voltage VREFOS is reflected to the internal voltage VCPP generated. Here, n is a subdivision ratio of the monitor circuit (level detection circuit) included in the charge pump voltage generating circuit 24 (the level of the internal voltage VCPP is adjusted by comparing the level of a subdivided voltage of the internal voltage with the reference voltage VOUT16).

Figure 3:
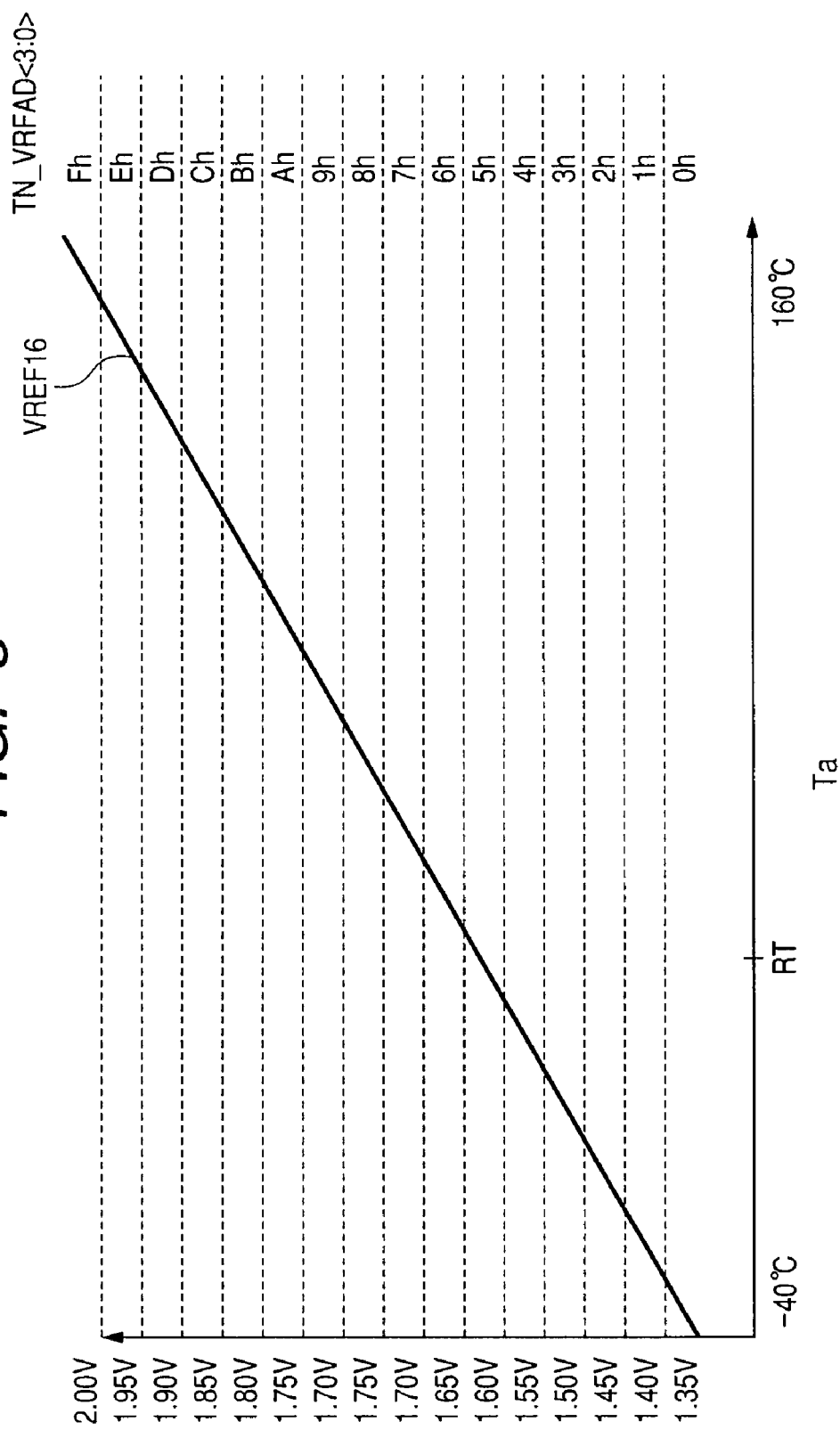
FIG. 3 is a graph illustrating an example of correspondence of a standard voltage and a digital conversion value, respectively generated by a temperature characteristic adding circuit and an A/D conversion circuit illustrated in FIG. 1.

FIG. 3 is a graph schematically illustrating correspondence of the standard voltage VREF16 generated by the temperature characteristic adding circuit 10 and the digital standard voltage code TN_VRFAD <3:0> generated by the A/D conversion circuit 12, as illustrated in FIG. 2. In FIG. 3, the horizontal axis indicates temperature Ta and the vertical axis indicates voltage V. The range of the temperature Ta is −40° C. to 160° C., and the range of the standard voltage VREF16 is 1.35 V to 2.00 V. In the room temperature RT, the standard voltage VREF16 is set as 1.60 V. By utilizing the standard voltage VREF16 as illustrated in FIG. 3, the standard voltage VREF16 only changes 0.65 V over the temperature range of 200° C., therefore, it is possible to perform a positive temperature compensation of 3 mV/° C.

As illustrated in FIG. 3, the standard voltage VREF16 is divided at a step of 0.05 V over the range of 1.35 V to 2.00 V, and to each voltage level, a standard voltage code TN_PRFAD <3:0> is allocated, more specifically, code 0 to code F (hexadecimal representation h) is allocated. The standard voltage VREF16 changes linearly. The standard voltage VREF16 generated has the voltage change range of 1.35 V to 2.00 V, and the temperature compensation range is comparatively small, accordingly the standard voltage VREF16 can be generated with an enough margin.

Figure 4:
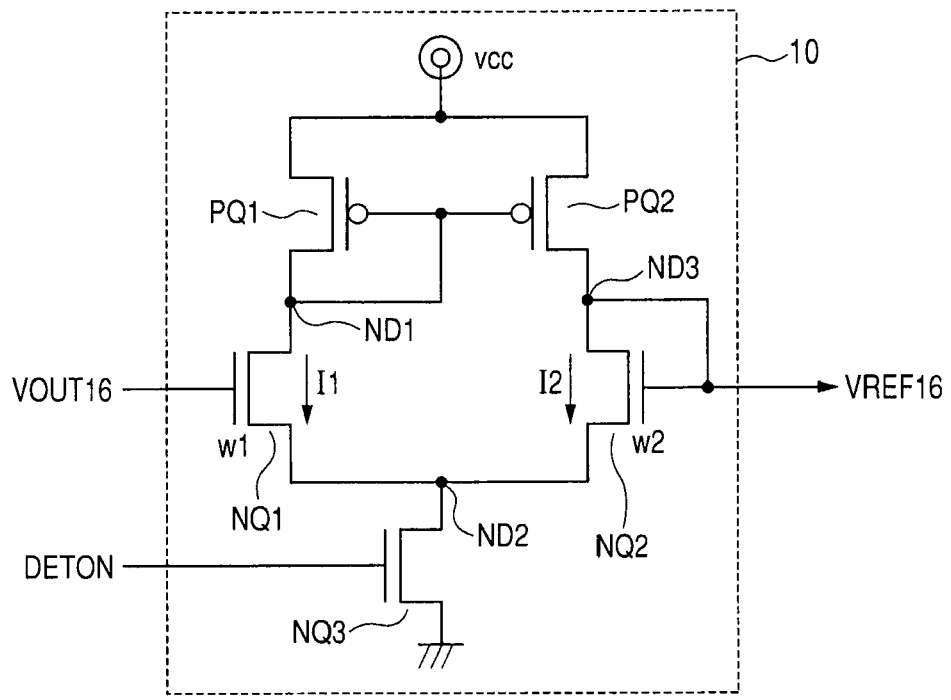
FIG. 4 is a drawing schematically illustrating an example of configuration of the temperature characteristic adding circuit illustrated in FIG. 2.

FIG. 4 illustrates an example of configuration of the temperature characteristic adding circuit 10 illustrated in FIG. 2. In FIG. 4, the temperature characteristic adding circuit 10 is coupled to a power node, and includes P-channel MOS transistors (insulated-gate field effect transistors) PQ1 and PQ2 which configure a current mirror stage, N-channel MOS transistors NQ1 and NQ2 which perform differential amplification of the reference voltage VOUT16 and the standard voltage VREF16, and an N-channel MOS transistor NQ3 which activates the temperature characteristic adding circuit 10 according to an activation signal DETON.

The P-channel MOS transistor PQ1 is coupled between the power node and an internal node ND1, and the gate of the P-channel MOS transistor PQ1 is coupled to the internal node ND1. The P-channel MOS transistor PQ2 is coupled between the power node and an internal node (internal output node) ND3, and the gate of the P-channel MOS transistor PQ2 is coupled to the internal node ND1. The N-channel MOS transistor NQ1 is coupled between the internal node ND1 and an internal node ND2, and the gate of the N-channel MOS transistor NQ1 receives the reference voltage VOUT16. The N-channel MOS transistor NQ2 is coupled between the internal output node ND3 and the internal node ND2, and the gate of N-channel MOS transistor NQ2 is coupled to the internal output node ND3.

The N-channel MOS transistors NQ1 and NQ2 are set so as to have mutually different channel widths W1 and W2, respectively, and the standard voltage VREF16 is generated from the gate (the node ND3) of the N-channel MOS transistor NQ2.

The MOS transistor NQ3 is coupled between the node ND1 and a ground node. When the activation signal DETON is activated, the MOS transistor NQ3 is conducted and forms a path through which current flows from the power node to the ground node.

The activation signal DETON is generated corresponding to an operation mode by a control circuit (not shown). The operation mode is a mode in which the internal voltage VCPP is used. In a flash memory, for example, when the internal voltage is a high voltage for erasure, the activation signal DETON is activated when an erasure mode is specified. The activation signal DETON may always be in an active state while the semiconductor integrated circuit device including the present internal voltage generating circuit is in an enabled state. What is necessary is that the activation signal DETON is just in an active state, at the time of the operation mode in which the internal voltage VCPP is used.

In the temperature characteristic adding circuit 10 illustrated in FIG. 4, the MOS transistor PQ1 configures a master of the current mirror stage, and supplies current to the MOS transistor NQ1. The MOS transistor NQ1 drives current corresponding to a voltage level of the reference voltage VOUT16 supplied to the gate of the MOS transistor NQ1. Mirror current of current which flows through the MOS transistors PQ1 and NQ1 is supplied to the MOS transistor NQ2 from the MOS transistor PQ2 by current mirroring. The MOS transistor NQ2 has a gate and a drain which are interconnected, and operates as a current-to-voltage conversion element. Accordingly, the MOS transistor NQ2 sets the level of the standard voltage VREF16 to a voltage level corresponding to the current supplied from the MOS transistor PQ2. The MOS transistors NQ1 and NQ2 have mutually different channel widths, that is, W1≠W2.

Now, in order to simplify explanation, it is assumed that the MOS transistor NQ1 operates in a saturation region and flows operation current I1. The current I1 which flows through the MOS transistor NQ1 is supplied from the MOS transistor PQ1, and the mirror current is supplied from the MOS transistor PQ2 to the MOS transistor NQ2. It is assumed that the MOS transistors PQ1 and PQ2 have the same size (a ratio of a channel width to a channel length), and that the mirror ratio is one. On the present condition, the current I1 and the current I2 which flow through the MOS transistors NQ1 and NQ2, respectively, are expressed by the following expressions.

$$I1 \propto \beta1(VOUT16-Vth)^2,$$

$$I2 \propto \beta2(VREF16-Vth)^2.$$

Here, $\beta1$ and $\beta2$ are constants proportional to the ratio of the channel width to the channel length of the MOS transistors NQ1 and NQ2, respectively. The sign ^ stands for exponentiation.

Here, the mirror ratio is one (m=1), and I1 and I2 satisfies the following expression.

$$I2 = m \cdot I1 = I1$$

From these expressions, the following equation is derived.

$$VREF16 = A \cdot VOUT16 + (1-A)Vth, A = (m \cdot W1/W2)^{\wedge}(1/2) = (W1/W2)^{\wedge}(1/2) \quad (1)$$

Here, it is assumed that both thresholds of the MOS transistors NQ1 and NQ2 are equal to Vth. In Equation (1), the first term on the right-hand side is a constant. In the second term on the right-hand side, the threshold voltage Vth of the MOS transistors NQ1 and NQ2 has negative temperature dependence, and becomes smaller as temperature rises. Therefore, by setting a greater value than unity to the coefficient A in Equation (1), in other words, as for the channel widths W1 and W2, by forming the MOS transistors NQ1 and NQ2 so that the relationship of W1>W2 is satisfied, it is possible to impart a comparatively-large positive temperature dependence to the standard voltage VREF16.

Generally, the threshold voltage Vth is expressed by Vth0−k·T, and changes linearly to the absolute temperature T. Here, Vth0 stands for a threshold voltage at absolute zero temperature, and k is a temperature coefficient of the threshold voltage. Therefore, voltage having temperature dependence can be generated in the range of 1.35 V to 2.00 V, with sufficient controllability and with linear dependence on temperature.

In the temperature characteristic adding circuit 10 illustrated in FIG. 4, when the power supply voltage VCC is a 3-V power supply voltage system, the voltage range of 3 V to 3.6 V is permitted. Therefore, even if the standard voltage VREF16 changes between 1.35 V and 2.0 V, a voltage of about 1 V can be secured for the gate-to-source voltage of the MOS transistors PQ1, PQ2, NQ1, and NQ2. Accordingly, it is possible to make the MOS transistors operate fully stably, and to generate the standard voltage VREF16 stably.

Figure 5:
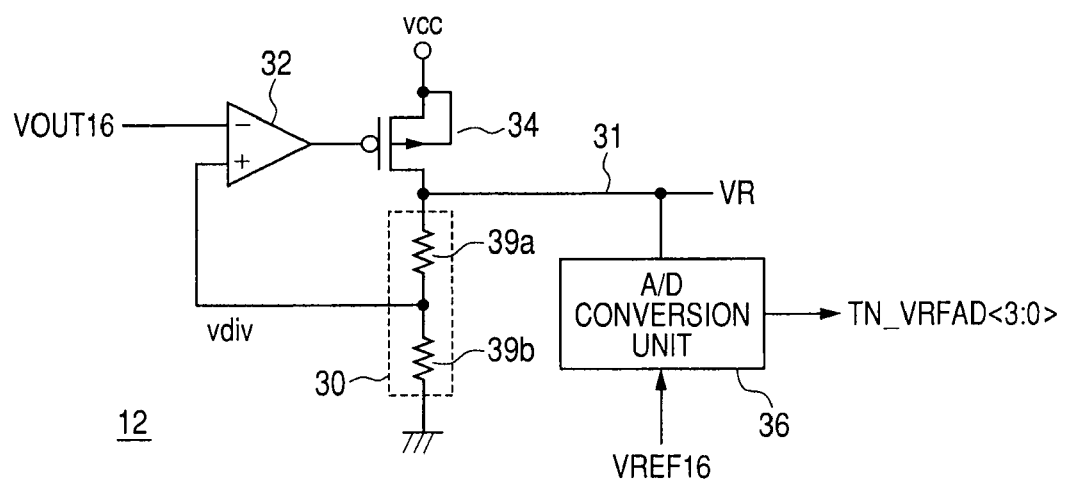
FIG. 5 is a drawing schematically illustrating a configuration of a standard voltage generating part of the A/D conversion circuit illustrated in FIG. 2.

FIG. 5 schematically illustrates an example of configuration of A/D conversion circuit 12 illustrated in FIG. 2. In FIG. 5, the A/D conversion circuit 12 includes a resistive subdivision circuit 30, a comparator 32, a P-channel MOS transistor 34, and an A/D conversion unit 36. The resistive subdivision circuit 30 subdivides a conversion standard voltage VR applied on a standard supply line 31. The comparator 32 compares an output voltage Vdiv of the resistive subdivision circuit 30 with the reference voltage VOUT16, and outputs a signal corresponding to the comparison result. The P-channel MOS transistor 34 supplies current to the standard supply line 31 from the power node according to the output signal of the comparator 32. The A/D conversion unit 36 performs the analog-to-digital conversion of the standard voltage VREF16 using the conversion standard voltage VR.

The resistive subdivision circuit 30 includes resistive elements 39a and 39b coupled in series between the standard supply line 31 and the ground node. The subdivided voltage Vdiv is generated from a connection node of these resistive elements 39a and 39b.

The comparator 32 outputs a signal corresponding to a difference of the reference voltage VOUT16 and the subdivided voltage Vdiv. When the voltage level of the reference voltage VOUT16 is higher than the subdivided voltage Vdiv, the comparator 32 outputs a low-level signal, raises conductance of the MOS transistor 34, and accordingly raises the level of the conversion standard voltage VR. On the other hand, when the reference voltage VOUT16 is lower than the subdivided voltage Vdiv, the comparator 32 outputs a high-level signal and reduces the conductance of the MOS transistor 34 (to set as an off state). Therefore, the conversion standard voltage VR applied on the standard supply line 31 is set as a voltage level that the subdivided voltage Vdiv and the reference voltage VOUT16 become equal. By utilizing the comparator 32, the MOS transistor 34, and the resistive subdivision circuit 30, the conversion standard voltage VR can be set as a desired voltage level corresponding to the reference voltage VOUT16, and not having temperature dependence.

What is necessary for the A/D conversion unit 36 is the configuration in which an analog-to-digital conversion operation of the standard voltage VREF16 is performed using the conversion standard voltage VR as the operation power voltage. Accordingly, an analog-to-digital converter having configuration of any one of a successive approximation type and a parallel comparison type may be used. An integral-type analog-to-digital conversion unit utilizing an integration operation of a capacitor may be also used, or a double-integral-type analog-to-digital converter may be also used. In the case of the double-integral-type configuration, it is not required to use in particular the conversion standard voltage VR (because a counter counts a discharge time of a capacitor charged by the standard voltage VREF16).

Accordingly, the analog-to-digital conversion can be accurately performed for the standard voltage VREF16 having temperature dependence, and the digital standard voltage code TN_VRFAD <3:0> corresponding to the standard voltage VREF16 can be generated.

Figure 6:
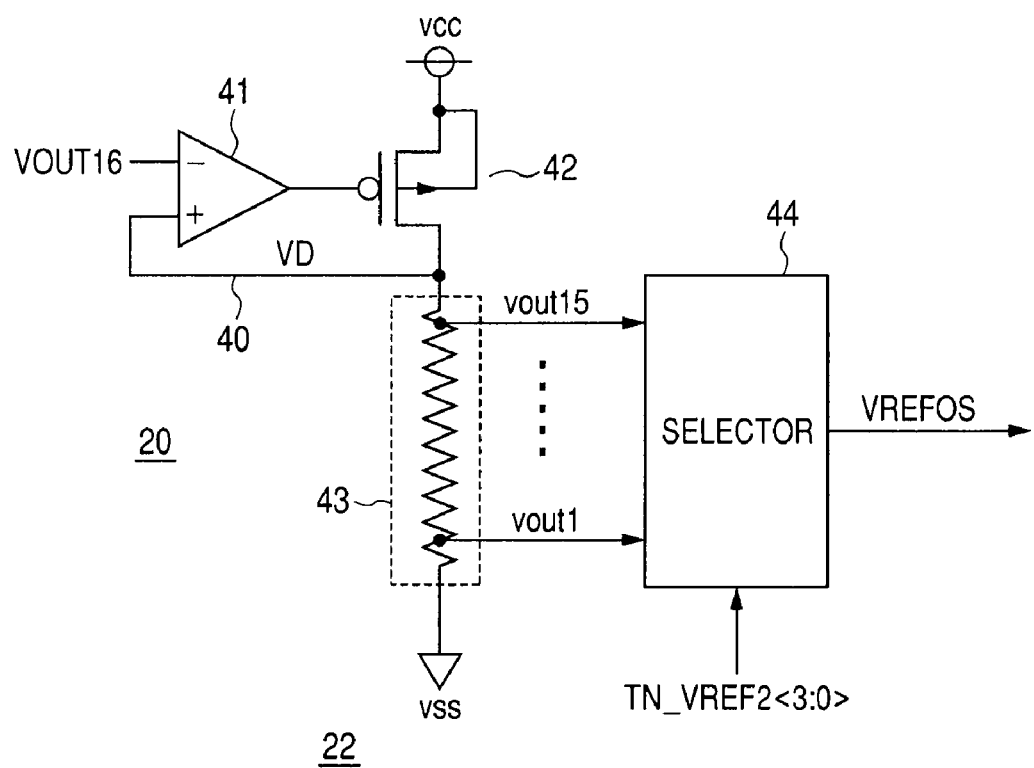
FIG. 6 is a drawing schematically illustrating a configuration of an offset voltage generating circuit illustrated in FIG. 2.

FIG. 6 schematically illustrates an example of configuration of the offset voltage generating circuit 20 illustrated in FIG. 2. In FIG. 6, the offset voltage generating circuit 20 includes a comparator 41, a P-channel MOS transistor 42, and a D/A conversion circuit 22. The comparator 41 compares voltage VD supplied on a standard supply node 40 with the reference voltage VOUT16. The P-channel MOS transistor 42 supplies current to the standard supply node 40 from the power node according to an output signal of the comparator 41. The D/A conversion circuit 22 generates analog candidate voltages with use of the voltage VD supplied on the standard supply node 40, selects one of the candidate voltages according to the target standard voltage code TN_VREF2 <3:0> from the adder circuit, and generates an analog offset voltage VREFOS.

When the voltage VD of the standard supply node 40 is higher than the reference voltage VOUT16, the comparator 41 outputs a high-level signal and reduces the conductance of the MOS transistor 42; accordingly, the level of the voltage VD is decreased. On the other hand, when the voltage level of the reference voltage VOUT16 is higher than the voltage VD, the comparator 41 outputs a low-level signal and raises the conductance of the MOS transistor 42; accordingly, the level of the voltage VD is increased. Therefore, the voltage VD applied on the standard supply node 40 is set as the same voltage level as the reference voltage VOUT16. By utilizing the comparator 41 and the MOS transistor 42, the amount of current supply to the standard supply node 40 is increased (this is because the output impedance of the circuit which generates the reference voltage VOUT16 is large and the amount of current supply (driving force) is small).

The D/A conversion circuit 22 includes a resistive subdivision circuit 43 and a selector 44. The resistive subdivision circuit 43 performs resistive subdivision of the voltage VD of the standard supply node 40. The selector 44 selects one of output voltages VOUT1-VOUT15 of the resistive subdivision circuit 43 according to the target standard voltage code TN_VREF2 <3:0>, and generates the offset voltage VREFOS.

The resistive subdivision by the resistive subdivision circuit 43 generates voltages at 15 steps. The selector 44 decodes the target standard voltage code TN_VREF2 <3:0> and selects one of the subdivided voltages according to the decoded result to generate the offset voltage VREFOS.

As the configuration of the adder circuit 14 illustrated in FIG. 2, what is necessary is just a circuit which can simply perform a 5-bit digital addition.

Figure 7:
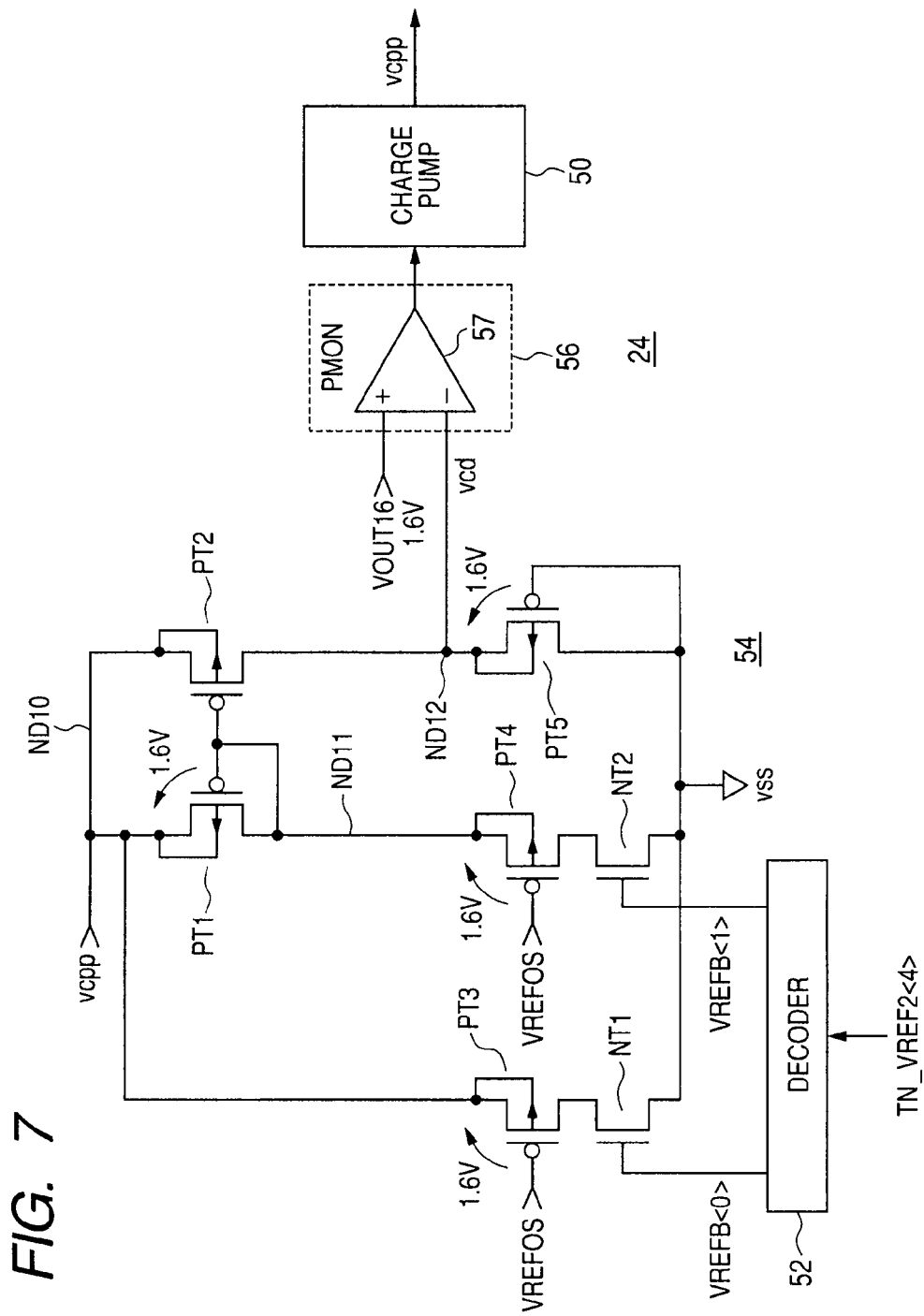
FIG. 7 is a drawing schematically illustrating an example of configuration of a charge pump voltage generating circuit illustrated in FIG. 2.

FIG. 7 schematically illustrates an example of configuration of the charge pump voltage generating circuit 24 illustrated in FIG. 2. In FIG. 7, the charge pump voltage generating circuit 24 includes a charge pump 50, a decoder 52, a divider 54, and a detector 56. The charge pump 50 generates an internal power supply voltage VCPP by a charge pump operation when activated. The decoder 52 decodes the most significant digital code bit TN_VREF2 <4> from the adder circuit 14 illustrated in FIG. 2. The divider 54 subdivides the internal power supply voltage VCPP according to output bits VREFB <0> and VREFB <1> of the decoder 52. The detector 56 controls operation of the charge pump 50 according to the subdivided output voltage Vcd of the divider 54 and the reference voltage VOUT16.

When activated, the charge pump 50 generates the internal power supply voltage VCPP by moving a charge with use of a charge pump operation of a capacitor.

According to a logical value "0" and "1" of the target standard voltage code bit TN_VREF2 <4>, the decoder 52 sets one of the decode bits VREFB <0> and VREFB <1> as "1" (H-level), and sets the other as "0" (L-level).

The divider 54 includes five P-channel MOS transistors PT1-PT5 and two N-channel MOS transistors NT1 and NT2. The MOS transistor PT1 is coupled between an input node ND10 and an internal node ND11, and the gate of the MOS transistor PT1 is coupled to the internal node ND11. The MOS transistor PT2 is coupled between the input node ND10 and an internal output node ND12, and the gate of the MOS transistor PT2 is coupled to the internal node ND11. The MOS transistors PT1 and PT2 configure a current mirror stage, and flow current of the same magnitude (when the mirror ratio is one).

The MOS transistors PT3 and NT1 are coupled in series between the input node ND10 and a ground node (VSS). The MOS transistors PT4 and NT2 are coupled in series between the internal node ND11 the ground node. The offset voltage VREFOS is supplied to the gates of the MOS transistors PT3 and PT4. The decode bits VREFB <0> and VREFB <1> from the decoder 52 are supplied to the gates of the MOS transistors NT1 and NT2, respectively.

The P-channel MOS transistors PT3 and PT4 flow current corresponding to the voltage difference of the offset voltage VREFOS and the internal voltage VCPP when the corresponding N-channel MOS transistors NT1 and NT2 are conducted. In this case, according to the decode bits VREFB <0> and VREFB <1>, one of the N-channel MOS transistors NT1 and NT2 is in a conducting state, and the other is in a non-conducting state, therefore current flows into one of the MOS transistors PT3 and PT4.

The P-channel MOS transistor PT5 is coupled between the internal output node ND12 and the ground node, and the gate of the P-channel MOS transistor PT5 is coupled to the ground node. Therefore, the P-channel MOS transistor PT5 functions as a resistive element, transforms current supplied from the MOS transistor PT2 into voltage, and generates a subdivided voltage Vcd.

The detector 56 is comprised of a comparator 57 which compares the subdivided voltage Vcd with the reference voltage VOUT16. When the reference voltage VOUT16 is higher than the subdivided voltage Vcd, the present comparator 57 activates a pump activation signal PMON, makes the charge pump 50 perform a pump operation, and raises a voltage level of the internal voltage VCPP. On the other hand, when the subdivided voltage Vcd is higher than the reference voltage VOUT16, the comparator 57 deactivates the pump activation signal PMON, and stops the pump operation of the charge pump 50. Therefore, the internal voltage VCPP generated by the charge pump 50 is set as a voltage level at which the reference voltage VOUT16 and the subdivided voltage Vcd become an equal voltage level.

Hereafter, operation of the detector 54 is explained briefly. Here it is assumed that the digital code bit VREFB <0> from the decoder 52 is "1", and that the MOS transistor NT1 is in a conducting state. The reference voltage VOUT16 is a constant voltage (for example, 1.6 V) independent of temperature.

In this case, the MOS transistor PT3 discharges current corresponding to the offset voltage VREFOS from the input node ND10 to the ground node. At this time, no current flows through a path of the MOS transistors PT1, PT4, and NT2 (the MOS transistor NT2 is in a non-conductive state). However, the gate and the drain of the MOS transistor PT1 are interconnected, accordingly, the MOS transistor PT1 operates in a diode mode, and maintains the internal node ND11 in the state where a voltage drop equal to an absolute value of the threshold voltage is produced. Therefore, current flows also from the MOS transistor PT2 to the MOS transistor PT5, and the subdivided voltage Vcd of the internal output node ND12 is generated by the resistance mode operation of the MOS transistor PT5.

When the subdivided voltage Vcd is lower than the reference voltage VOUT16, the pump activation signal PMON outputted by the comparator 57 is an H-level, and the charge pump 50 performs a pump operation and raises the voltage level of the internal power supply voltage VCPP. On the other hand, when the subdivided voltage Vcd becomes lower than the reference voltage VOUT16, the output signal of the comparator 57 becomes an L-level, and the pump activation signal PMON is deactivated and the charge pump 50 stops the pump operation. Therefore, the voltage level of the internal voltage VCPP is controlled to a voltage level at which the subdivided voltage Vcd is equal to the reference voltage VOUT16. In this case, the sources of both MOS transistors PT2 and PT3 are coupled to the internal input node ND10. Therefore, the current which is supplied from the internal voltage VCPP and flows from the internal input node ND10 via the MOS transistors PT2 and PT5 and the current which is supplied from the internal voltage VCPP and flows from the internal input node ND10 via the MOS transistor PT3 become equal mutually. Therefore, a gate-to-source voltage of the MOS transistor PT3 is the same as a gate-to-source voltage of the MOS transistor PT5, that is, the subdivided voltage Vcd. Therefore, in a steady state, the internal power supply voltage VCPP becomes as the sum (VREFOS+VOUT16) of the offset voltage VREFOF and the reference voltage VOUT16. Here it is assumed that the current drive power is equal (the ratio of channel width to channel length is equal) for all the MOS transistors PT1-PT5, and that an absolute value of the threshold voltage is also equal for all the MOS transistors PT1-PT5.

On the other hand, when the decode bit VREFB <1> from the decoder 52 turns to an H-level of "1", the MOS transistor NT2 becomes in a conducting state and the MOS transistor NT1 becomes in a non-conductive state. In this case, a path through which current flows from the internal input node ND10 via the MOS transistors PT1, PT4, and NT2 is formed; on the other hand, a path through which current flows via the MOS transistors PT3 and NT1 flows is cut off. Since the current of the same magnitude flows through the MOS transistors PT1 and PT4, the gate-to-source voltages of the MOS transistors PT4 and PT1 become equal. Since the current of the same magnitude flows through the MOS transistors PT1 and PT2, the gate-to-source voltage of the MOS transistor PT5 becomes equal to the gate-to-source voltage of the MOS transistors PT1 and PT4. Therefore, in a steady state, the internal power supply voltage VCPP becomes as VREFOS+2·VOUT16.

Therefore, in the decoder 52, the target standard voltage code bit TN_VREF2 <4> is decoded, and one of the MOS transistors NT1 and NT2 is rendered in a conducting state and the other is rendered in a non-conducting state according to the decoded result, and the amount of voltage drop in the current-flowing path is adjusted. Accordingly, the internal power supply voltage VCPP can be changed from the reference voltage VOUT16 to 2·VOUT16+VREFOS, according to the offset voltage VREFOS, that is, the standard voltage VREF16. For the reference voltage VOUT16 of 1.6 V, when the offset voltage VREFOS changes from 0.0 V to 1.5 V corresponding to temperature, the internal voltage can be changed between 1.6 V and 4.7 V. At the time of actual use, the voltage change range of the offset voltage VREFOS is restricted by the offset of the basic voltage code TN_VREF <4:0>, and correspondingly, the voltage range of the internal voltage VCPP is also restricted, as explained in the following.

Even when the internal voltage of a maximum of 4.7 V is generated, in the detector 54, the gate-to-source voltage applied of the MOS transistors PT1-PT5 is kept within a voltage range where the transistors operate stably (a sufficiently greater voltage level than the absolute value of the threshold voltage), accordingly it is possible to subdivide the internal voltage VCPP stably to generate the subdivided voltage Vcd.

Figure 8:
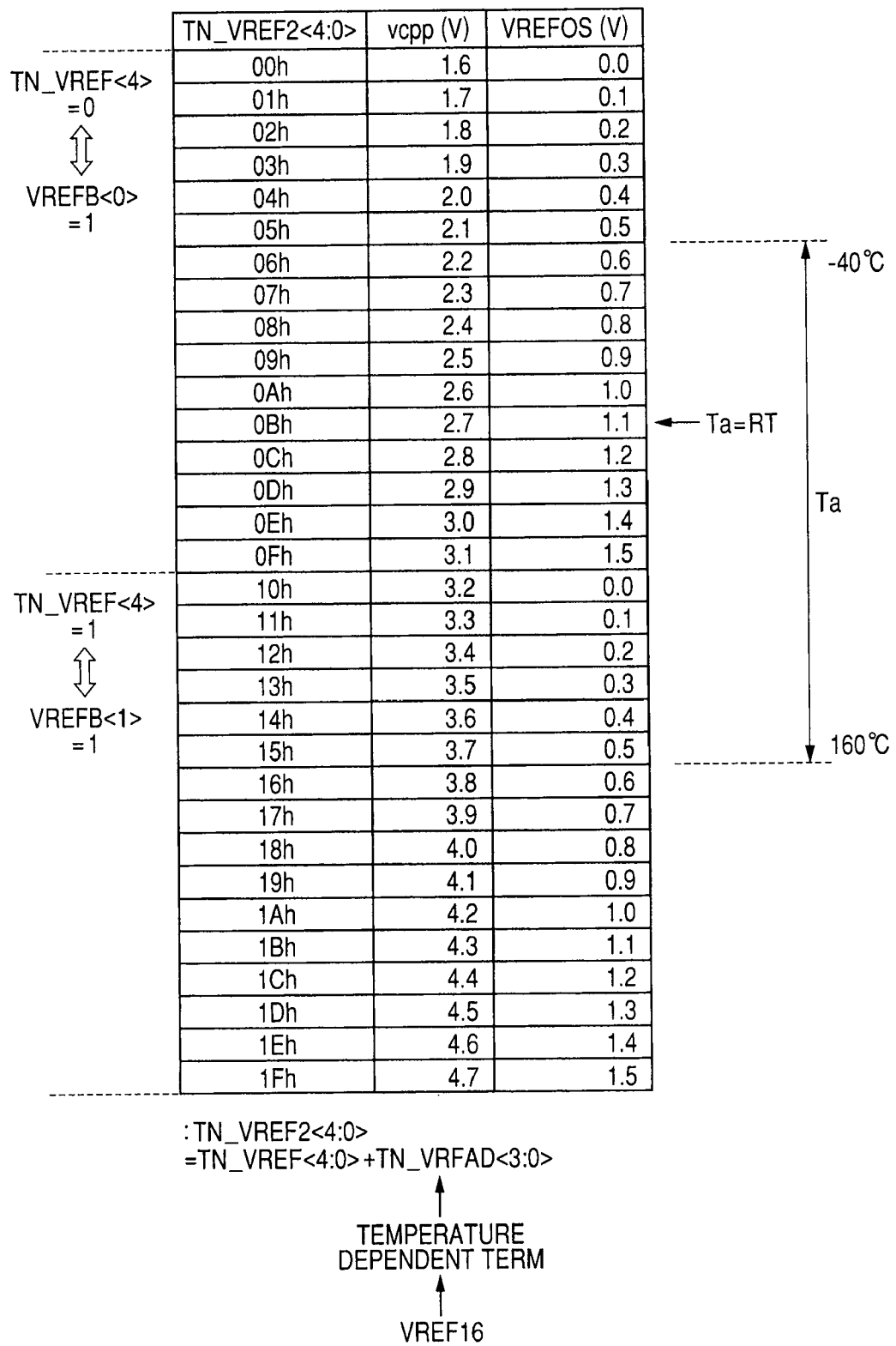
FIG. 8 is a drawing illustrating a correspondence list of an internal power supply voltage, an offset voltage, and a digital additional value, according to Embodiment 1 of the present invention.

FIG. 8 illustrates a list of correspondence relation of the target standard voltage code TN_VREF2 <4:0>, the internal voltage VCPP, and the offset voltage VREFOS. FIG. 8 illustrates values of the target standard voltage code TN_VREF2 <4:0> for the temperature Ta changing from −40° C. to 160° C., setting a voltage level of the internal voltage VCPP as 2.7 V when the temperature Ta is the room temperature RT. At the time of actual use, the offset voltage VREFOS is not set to 0.0 V due to the offset by the basic voltage code TN_VREF <3:0>.

The basic voltage code TN_VREF <4:0> is set up as follows. The digital standard voltage code TN_VRFAD <3:0> is generated by performing A/D conversion to the standard voltage VREF16 of a voltage range of 1.35 V to 2.00 V, and the code value changes from 0h to Fh. On the other hand, the target standard voltage code TN_VREF2 <4:0> changes from 00h to 1Fh, as illustrated in FIG. 8. When the value of the digital standard voltage TN_VRFAD <3:0> is 5h in case of the standard voltage VREF16 of 1.60 V at the room temperature RT (refer to FIG. 3), the basic voltage code TN_VREF <4:0> is generated so that the 4-bit target standard voltage code TN_VREF2 <3:0> in the room temperature RT becomes a value of Bh as illustrates in FIG. 8.

The code value of the digital standard voltage code TN_VRFAD <3:0> is shifted by addition of the basic voltage code TN_VREF <4:0>. Accordingly the standard voltage VREF16 illustrated in FIG. 3 can be shifted by 6h, and the internal voltage VCPP which has the temperature characteristic of the range of 06h to 15h can be generated as in FIG. 8. Extrapolating the present voltage change range, values of the code TN_VREF <4:0>, the offset voltage VREFOS, and the internal voltage VCPP are set up as illustrated in FIG. 8. According to the standard voltage VREF16, the internal voltage VCPP and the offset voltage VREFOS change in the range offset by the basic voltage code TN_VREF <3:0>. In FIG. 8, the area in which the internal voltage VCPP changes from 2.2 V at −40° C. to 3.7 V at 160° C. is used.

In FIG. 8, in the range of the digital code TN_VREF2 <4:0> changing from 00h (hexadecimal) to 0Fh (hexadecimal), the offset voltage VREFOS is incremented sequentially by a step of 0.1 V from 0.0 V to 1.5 V. Correspondingly, since the reference voltage is set as VOUT16=1.6 V, the internal voltage VCPP is incremented sequentially by a step of 0.1 V from the reference voltage VOUT16. In the present range, the bit TN_VREF <4> is "0", the decode bit VREFB <0> illustrated in FIG. 7 is "1", and the level of the internal power supply voltage VCPP is set up by the MOS transistor PT3.

On the other hand, also in the range of the digital code TN_VREF2 <4:0> changing from 10h (hexadecimal) to 1Fh (hexadecimal), the offset voltage VREFOS is incremented sequentially by a step of 0.1 V in the range of 0.0 V to 1.5 V, since the offset voltage VREFOS is defined by the lower 4-bit code TN_VREF2 <3:0>. This is because the value of the lower 3-bit TN_VREF2 <3:0> is same as the value at the time of the internal voltage VCPP in the range of 1.6 V to 3.1 V. On the other hand, the highest code bit TN_VREF2 <4> is "1" at this time; correspondingly, the decode bit VREFB <1> illustrated in FIG. 7 is "1". Therefore, the value of the reference voltage VOUT16 is further offset by the MOS transistors PT4 and NT2 to the internal power supply voltage VCPP. Accordingly, in the range, the internal power supply voltage VCPP is incremented sequentially by a step of 0.1 V in the range from 3.2 V to 4.7 V.

The voltage range of the internal voltage VCPP used can be changed suitably corresponding to the value of the basic voltage code TN_VREF <4:0>, in the code table illustrated in FIG. 8. In any voltage range, the voltage can be changed by 1.5 V for the temperature range of 200° C., as illustrated in FIG. 8, allowing the generation of voltage having a large temperature characteristic of 7.5 mV/° C. The offset voltage is generated by the digital-to-analog conversion of the target standard voltage code TN_VREF2 <4:0>. Therefore, it is possible to generate the offset voltage which changes linearly with temperature; correspondingly, it is possible to change the level of the internal voltage VCPP linearly corresponding to temperature.

The internal voltage VCPP changes in the range from 2.2 V to 3.7 V corresponding to temperature. Moreover, it is possible to generate the internal voltage VCPP up to the maximum voltage of 4.7 V. However, when any voltage range of the internal voltage VCPP is used, the offset voltage VREFOS is in the range from 0.0 V to 1.5 V, and the standard voltage VREF16 used as the criteria of the offset voltage VREFOS only changes from 1.35 V to 2.00 V. Therefore, in the temperature characteristic adding circuit, the offset voltage generating circuit, and the charge pump voltage generating circuit for generating the internal voltage VCPP, it is possible to operate the MOS transistors stably and it is possible to generate the internal power supply voltage having a desired, comparatively-large temperature characteristic, with sufficient controllability and stability. Correspondingly, it is possible to stably maintain the operating characteristic of a circuit which uses the internal voltage concerned over a broad temperature range.

In the above-described explanation, the basic voltage code TN_VREF <4:0> is a 5-bit configuration, and, on the other hand, the A/D conversion circuit generates the 4-bit digital standard voltage code TN_VRFAD <3:0>. Accordingly, the 5-bit information TN_VREF2 <4:0> is generated as the final standard voltage code information for temperature compensation. However, the number of bits may be decided suitably, depending on a range and a step voltage value of the temperature-compensated voltage to be generated.

In the above-described explanation, the internal voltage VCPP is generated based on the offset voltage VREFOS. However, the internal voltage may be generated by the digital-to-analog conversion of all the bits of the target standard voltage code TN_VREF2 <4:0>, or alternatively, the internal voltage may be generated according to the digital-to-analog conversion voltage (the level of the internal voltage is set up by the comparison of the internal voltage and the digital-to-analog conversion voltage). Also in this case, it is possible to generate the internal voltage having a temperature characteristic from a low standard voltage having a small temperature characteristic, with a high degree of accuracy.

As described above, according to Embodiment 1 of the present invention, after performing the digital conversion of voltage having a temperature characteristic, the standard code information and the digital information concerned are added, the final temperature dependence digital code information is generated, and the analog voltage depending on the digital code information is generated. Therefore, it is possible to operate the internal voltage generating circuit by setting the operating range of MOS transistors as the components in the stable operation range; accordingly, it is possible to generate the temperature-compensated internal voltage with a high degree of accuracy and stability.

Embodiment 2

Figure 9:
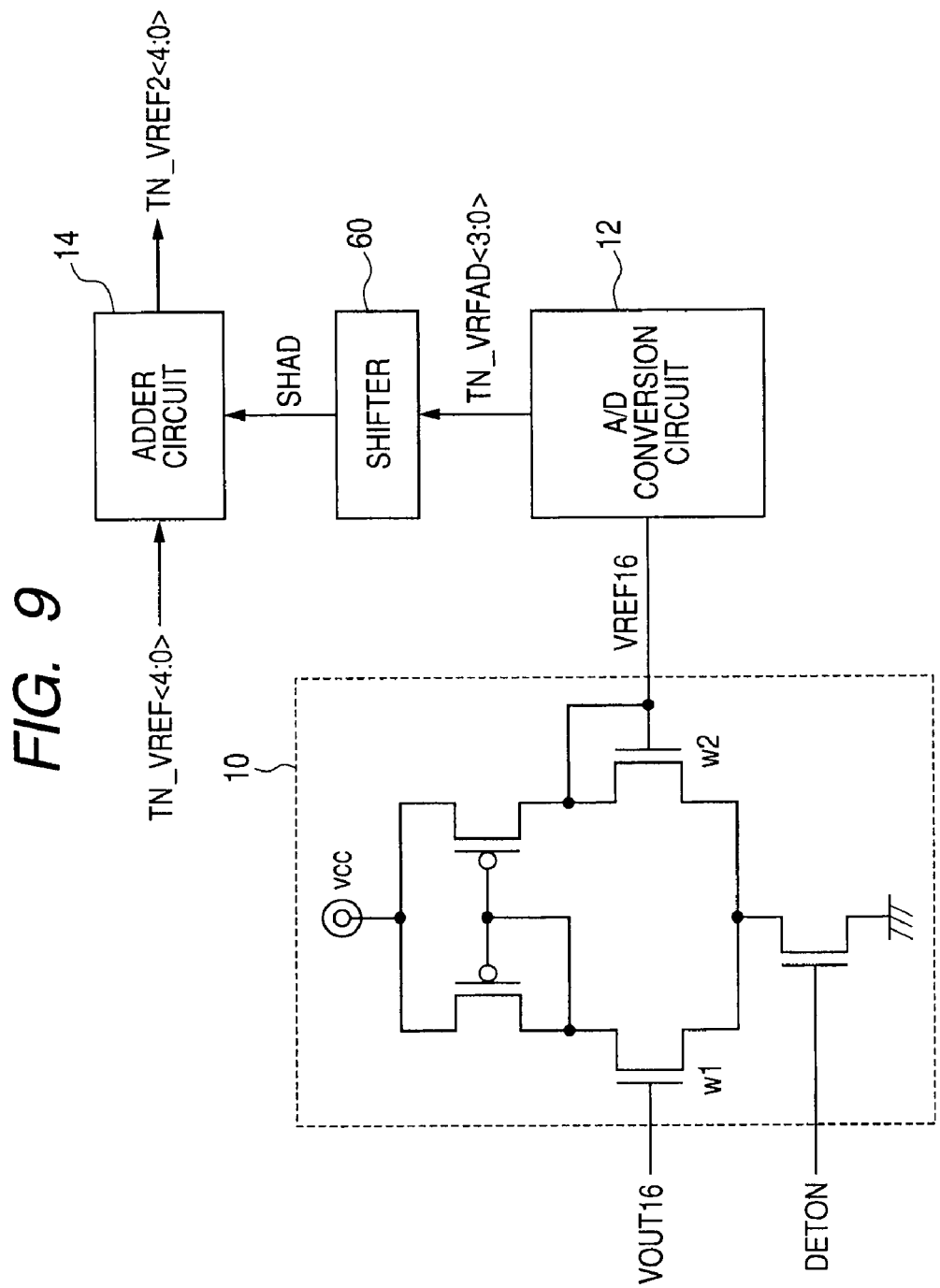
FIG. 9 is a drawing schematically illustrating a configuration of the principal part of an internal voltage generating circuit according to Embodiment 2 of the present invention.

FIG. 9 schematically illustrates a configuration of the principal part of an internal voltage generating circuit according to Embodiment 2 of the present invention. In the configuration illustrated in FIG. 9, a shifter 60 is provided between the A/D conversion circuit 12 and the adder circuit 14. The present shifter 60 executes a right shift operation by one bit or a left shift operation by one bit to the digital standard voltage code TN_VRFAD <3:0> outputted by the A/D conversion circuit 12. By the operation, multiplication or division of the output code TN_VRFAD <3:0> of the A/D conversion circuit 12 is performed. A shift code SHAD from the shifter 60 is supplied to the adder circuit 14, and added with the basic voltage code TN_VREF <4:0>.

The configuration of the temperature characteristic adding circuit 10, the A/D conversion circuit 12, and the adder circuit 14 of the internal voltage generating circuit illustrated in FIG. 9, and the components of the remaining internal voltage generating circuit are the same as those in Embodiment 1, therefore, the same reference number is attached to a corresponding part, and the detailed explanation thereof is omitted.

Figure 10:
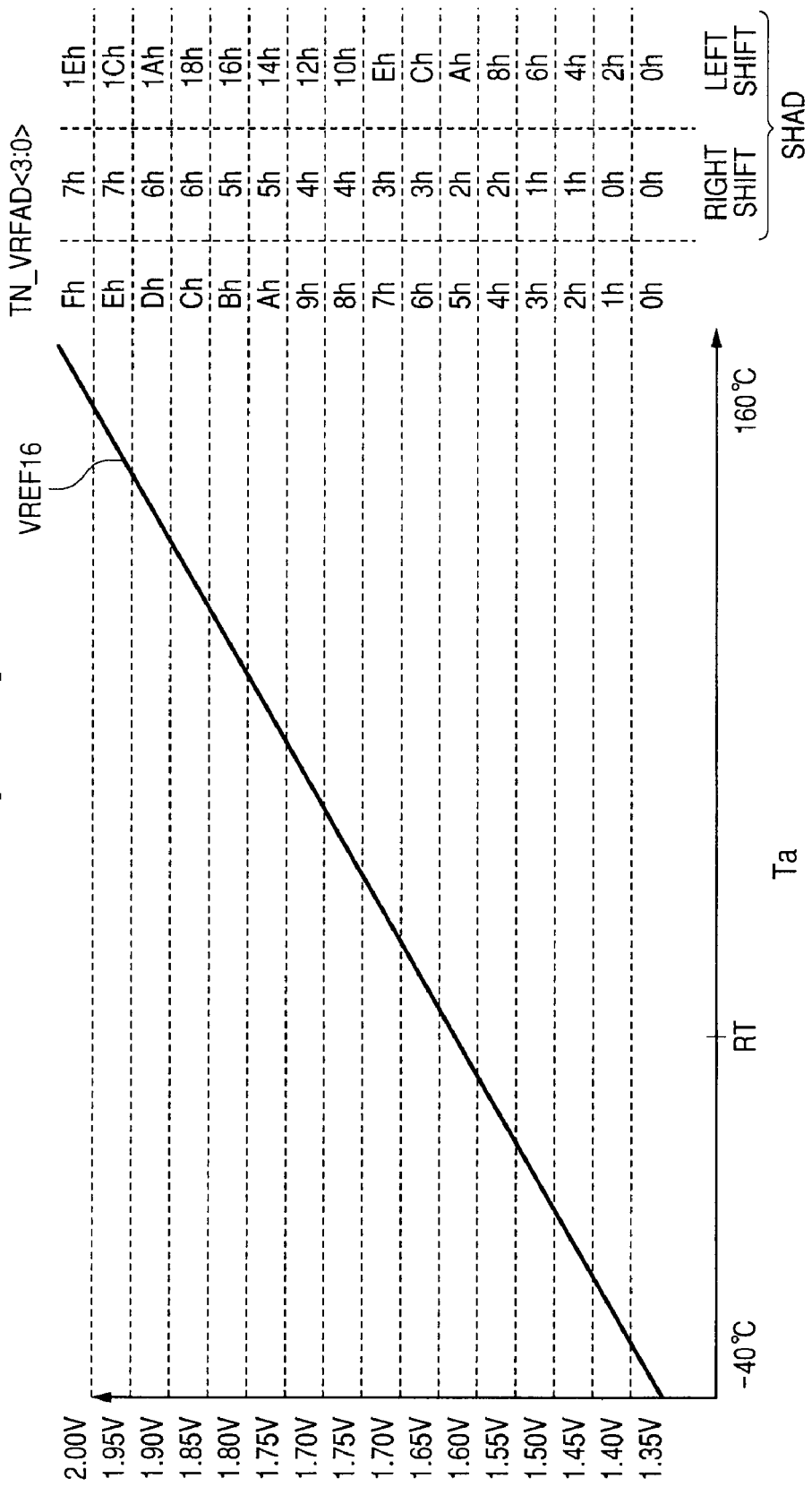
FIG. 10 is a graph illustrating an example of correspondence of a standard voltage having temperature dependence and an output code of a shifter, in the internal voltage generating circuit illustrated in FIG. 9.

FIG. 10 illustrates a correspondence list of a code SHAD after shifting by a one-bit right shift operation and a one-bit left shift operation in the shifter 60, an output value TN_VRFAD <3:0> of the A/D conversion circuit 12, and a standard voltage VREF16, according to Embodiment 2 of the present invention.

When the shifter 60 performs a one-bit right shift operation in FIG. 10, the output value TN_VRFAD <3:0> of the A/D conversion circuit 12 is divided by two, the shift code SHAD takes a value from 0h to 7h, accordingly obtaining a voltage change range of a half of the change range 0h-Fh of the code TN_VRFAD <3:0>, as an offset value to the basic voltage code.

On the other hand, when the shifter 60 performs a one-bit left shift operation, it is possible to generate the bit value SHAD after shifting from 0h to 1Eh, accordingly obtaining a twice as much voltage compensation range. By utilizing the 5-bit shift data SHAD <4:0> after the one-bit left shift operation, it becomes possible to attach twice as much shift voltage of the reference voltage VOUT16 to the basic voltage code TN_VREF <3:0>.

FIG. 11 illustrates a correspondence list of the offset voltage VREFOS, the internal voltage VCPP, and the target standard voltage code TN_VREF2 <4:0> after addition, according to Embodiment 2 of the present invention. In FIG. 11, the range of a tuning code (target standard voltage code) TN_VREF2 <4:0> is illustrated for temperature Ta from −40° C. to 160° C. When temperature Ta is the room temperature RT, the internal voltage VCPP is set as 2.7 V.

In FIG. 11, when the one-bit left shift operation is performed, the digital standard voltage code TN_VRFAD <3:0> changes in a range from 00h to 1Eh by two steps. Therefore, by addition with the basic voltage code TN_VREF <4:0>, the internal voltage VCPP can have the temperature characteristic of the range from 1.7 V to 4.7 V for temperature Ta from −40° C. to 160° C. The value of the basic voltage code TN_VREF <4:0> is set up so that the basic voltage code TN_VREF <3:0> should produce a value 1.1 V of the offset voltage VREFOS at the room temperature.

On the other hand, when the one-bit right shift operation is performed, the digital standard voltage code TN_VRFAD <3:0> changes in a range from 0h to 7h by a step. By addition with the basic voltage code TN_VREF <4:0>, the change range of the offset voltage VREFOS is shifted from the range from 0.0 V to 0.7 V to a range including the room temperature RT, and the internal voltage VCPP can be changed from 2.5 V to 3.2 V.

Therefore, it is possible to generate the internal power supply voltage having a large temperature characteristic, using the standard voltage having a small temperature characteristic. Since the generation of the internal power supply voltage is digitized, it is possible to control the level of the internal power supply voltage linearly, depending on temperature.

FIG. 12 schematically illustrates a configuration of a charge pump voltage generating circuit in the case where the shifter 60 performs a one-bit left shift operation. The charge pump voltage generating circuit illustrated in FIG. 12 has a different configuration from the charge pump voltage generating circuit illustrated in FIG. 7 in the following points. That is, a decoder 70 decodes a tuning code bit TN_VREF2 <5:4>, and generates three decode bits VREFB <0>, VREFB <1>, and VREFB <2>. The tuning code bit TN_VREF2 <5:4> is the upper two bits of the 6-bit target standard voltage code TN_VREF <5:0> generated by the adder circuit 14. That is, in the adder circuit 14, the standard voltage code bit TN_VREF2 <4:0> and 2·VREF <3:0> outputted by the shifter are added. In this case, the shift bit, 2·VREF <3:0> outputted by the shifter (60) becomes 5-bit data, and the added result by the adder circuit 14 becomes 6-bit data. Therefore, the upper two bits, TN_VREF2 <5:4>, are decoded by the decoder 70.

In a detector 54, a P-channel MOS transistors PT6, PT7, and PT8, and an N-channel MOS transistor NT3 are coupled in series between an internal input node ND10 and a ground node. The gate of the MOS transistor PT6 is coupled to an internal node ND11, and the gates of MOS transistors PT1, PT2, and PT6 are coupled in common. The gate and the drain of the MOS transistor PT7 are interconnected and the source of the MOS transistor PT7 is coupled to the drain node of the MOS transistor PT6. An offset voltage VREFOS is inputted to the gate of the PWMOS transistor PT8. A decode bit VREFB <2> is inputted to the gate of the N-channel MOS transistor NT3.

The other configuration of the divider 54 illustrated in FIG. 12 is the same as the configuration illustrated in FIG. 7; accordingly, the same reference number is attached to the corresponding part, and the detailed explanation thereof is omitted. The configuration of the detector 56 and the charge pump 50 is the same as that of the charge pump voltage generating circuit illustrated in FIG. 7; accordingly, the same reference number is attached to the corresponding part, and the detailed explanation thereof is omitted.

In the divider 54 illustrated in FIG. 12, when a decode bit VREFB <2> turns to "1", the N-channel MOS transistor NT3 becomes in a conducting state, and a path through which current flows via the MOS transistors PT6, PT7, PT8, and NT3 is formed. In this case, a gate-to-source voltage of the MOS transistors PT6-PT8 at a stable time becomes a voltage level equal to the reference voltage VOUT16. Therefore, at this time, it is possible to generate a level of voltage VREFOS+3·VOUT16 as the internal power supply voltage VCPP, from the offset voltage VREFOS and the reference voltage VOUT16.

In the present case, therefore, even when the standard voltage VREF16 has a small temperature characteristic and a small range of voltage which changes depending on temperature, it is possible to stably generate the power supply voltage VCPP which has a sufficiently large temperature characteristic.

As described above, according to Embodiment 2 of the present invention, the standard voltage VREF16 is shifted by the shifter (60) after A/D conversion. Therefore, a change range of the output value of the adder circuit, that is, a voltage change range of the offset voltage, can be set in the desired range. Correspondingly, even when the temperature characteristic of the standard voltage has a narrow range, it is possible to generate the offset voltage which has a required temperature compensation range; accordingly, it is possible to generate the internal voltage which has the temperature compensation characteristic in a wide range.

Also in Embodiment 2, the shifting operation of the shifter is not restricted to the one-bit right shift or the one-bit left shift, as describe above, but alternatively, the shifting operation of the shifter may be right shift or left shift by a necessary number of bits, such as two bits.

In Embodiment 1 and Embodiment 2 of the present invention, when the voltage VCPP is generated as an internal voltage, the voltage VCPP is used, for example as an internal writing voltage or an internal erasing voltage in the flash memory. However, the internal voltage VCPP may be employed as the internal voltage which is utilized in the interior of the semiconductor integrated circuit device and requires temperature compensation.

The charge pump is utilized as a circuit which generates the internal voltage. However, if a power supply voltage generating circuit uses a step-down circuit or an operational amplifier, such a power supply voltage generating circuit can utilizes the configuration of the present invention. For example, the internal power supply voltage may be generated by the step-down circuit using the offset voltage VREFOS as the reference voltage.

The present invention is generally applicable to a circuit which needs to perform temperature compensation of an internal voltage. For example, when the present invention is applied to a circuit included in a microcomputer or a system-on-chip which has a semiconductor memory device or a memory module built-in, it is possible to generate the temperature-compensated internal voltage with improved controllability and stability.

What is claimed is:

1. An internal voltage generating circuit comprising:
    a standard voltage generating circuit operable to generate a standard voltage having temperature dependence;
    an analog-to-digital conversion circuit operable to convert the standard voltage into a digital value;
    an adder circuit operable to add a basic digital value defining a level of an internal voltage to be generated, to an output digital value of the analog-to-digital conversion circuit; and
    a power supply circuit operable to perform digital-to-analog conversion of an output value of the adder circuit and to generate the internal voltage based on the analog conversion voltage,
    wherein the standard voltage generating circuit comprises:
    a circuit operable to generate, from a reference voltage not having temperature dependence, a standard voltage having temperature dependence, and
    wherein the power supply circuit comprises:
    an internal power supply operable to generate a voltage corresponding to the reference voltage not having the temperature dependence at a first power node;
    a resistive subdivision circuit operable to generate a plurality of levels of subdivided voltage by resistive subdivision of voltage between the first power node and a second power node; and
    a selection circuit operable to select one of the plural levels of the subdivided voltage to generate the analog conversion voltage, according to an output digital value outputted from the adder circuit.

2. The internal voltage generating circuit according to claim 1, further comprising:
    a shift circuit arranged between the adder circuit and the analog-to-digital conversion circuit, the shift circuit operable to shift in digit an output digital value of the analog-to-digital conversion circuit and to provide the digital value shifted in digit for the adder circuit.

3. The internal voltage generating circuit according to claim 1,
    wherein the power supply circuit further comprises:
    a divider operable to adjust a level of the internal voltage, according to the analog conversion voltage and a prescribed output bit of the adder circuit; and
    a power supply voltage generating circuit operable to generate the internal voltage by comparing an output voltage of the divider with the reference voltage.

* * * * *